(12) United States Patent
Satoskar (10) Patent No.: US 9,998,826 B2
(45) Date of Patent: Jun. 12, 2018

(54) OPTIMIZATION OF PERFORMANCE AND POWER IN AUDIO SYSTEM

(71) Applicant: Cirrus Logic International Semiconductor Ltd., Edinburgh (GB)

(72) Inventor: Aniruddha Satoskar, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days. days.

(21) Appl. No.: 15/195,711

(22) Filed: Jun. 28, 2016

(65) Prior Publication Data

US 2017/0374459 A1    Dec. 28, 2017

(51) Int. Cl.
*H04R 3/04* (2006.01)
*G06F 3/16* (2006.01)
*H04R 29/00* (2006.01)

(52) U.S. Cl.
CPC .............. *H04R 3/04* (2013.01); *G06F 3/165* (2013.01); *H04R 29/001* (2013.01); *H04R 2430/01* (2013.01); *H04R 2430/03* (2013.01)

(58) Field of Classification Search
CPC .... H04R 3/04; H04R 29/001; H04R 2430/01; H04R 2430/03; G06F 3/165
See application file for complete search history.

(56) References Cited

U.S. PATENT DOCUMENTS 4,346,349 A   8/1982 Yokoyama
4,441,081 A   4/1984 Jenkins
(Continued)

FOREIGN PATENT DOCUMENTS

EP   0351788 A2   7/1989
EP   0966105 A2   12/1999
(Continued)

OTHER PUBLICATIONS

Thaden, Rainer et al., A Loudspeaker Management System with FIR/IRR Filtering; AES 32nd International Conference, Hillerod, Denmark, Sep. 21-23, 2007; pp. 1-12.
(Continued)

*Primary Examiner* — Brenda C Bernardi
(74) *Attorney, Agent, or Firm* — Jackson Walker L.L.P.

(57) ABSTRACT

In accordance with embodiments of the present disclosure, a method for operating a playback path comprising a first dynamic range enhancement subsystem and a second dynamic range enhancement subsystem, wherein an audio signal generated by the first dynamic range enhancement subsystem is communicated to the second dynamic range enhancement subsystem, is provided. The method may include determining a first operating parameter of one of the first dynamic range enhancement subsystem and the second dynamic range enhancement subsystem that affects behavior of the other of the first dynamic range enhancement subsystem and the second dynamic range enhancement subsystem, communicating a control signal between the first dynamic range enhancement subsystem and the second dynamic range enhancement subsystem indicative of the first operating parameter, and setting a second operating parameter of the other of the first dynamic range enhancement subsystem and the second dynamic range enhancement subsystem in response to receipt of the control signal.

12 Claims, 4 Drawing Sheets

(56) References Cited

U.S. PATENT DOCUMENTS

| | | |
|---|---|---|
| 4,446,440 A | 5/1984 | Bell |
| 4,493,091 A | 1/1985 | Gundry |
| 4,890,107 A | 12/1989 | Pearce |
| 4,972,436 A | 11/1990 | Halim et al. |
| 4,999,628 A | 3/1991 | Kakaubo et al. |
| 4,999,830 A | 3/1991 | Agazzi |
| 5,077,539 A | 12/1991 | Howatt |
| 5,148,167 A | 9/1992 | Ribner |
| 5,198,814 A | 3/1993 | Ogawara et al. |
| 5,272,449 A | 12/1993 | Izawa |
| 5,321,758 A | 6/1994 | Charpentier et al. |
| 5,323,159 A | 6/1994 | Imamura et al. |
| 5,343,161 A | 8/1994 | Tokumo et al. |
| 5,550,923 A | 7/1996 | Hotvet et al. |
| 5,600,317 A | 2/1997 | Knoth et al. |
| 5,714,956 A | 2/1998 | Jahne et al. |
| 5,719,641 A | 2/1998 | Mizoguchi |
| 5,796,303 A | 8/1998 | Vinn et al. |
| 5,808,575 A | 9/1998 | Himeno et al. |
| 5,810,477 A | 9/1998 | Abraham et al. |
| 6,088,461 A | 7/2000 | Lin |
| 6,160,455 A | 12/2000 | French et al. |
| 6,201,490 B1 | 3/2001 | Kawano et al. |
| 6,271,780 B1 | 8/2001 | Gong et al. |
| 6,333,707 B1 | 12/2001 | Oberhammer et al. |
| 6,353,404 B1 | 3/2002 | Kuroiwa |
| 6,542,612 B1 | 4/2003 | Needham |
| 6,614,297 B2 | 9/2003 | Score et al. |
| 6,683,494 B2 | 1/2004 | Stanley |
| 6,745,355 B1 | 6/2004 | Tamura |
| 6,768,443 B2 | 7/2004 | Willis |
| 6,822,595 B1 | 11/2004 | Robinson |
| 6,853,242 B2 | 2/2005 | Melanson et al. |
| 6,888,888 B1 | 5/2005 | Tu et al. |
| 6,897,794 B2 | 5/2005 | Kuyel et al. |
| 6,989,955 B2 | 1/2006 | Ziemer et al. |
| 7,020,892 B2 | 3/2006 | Levesque et al. |
| 7,023,268 B1 | 4/2006 | Taylor et al. |
| 7,061,312 B2 | 6/2006 | Andersen et al. |
| 7,167,112 B2 | 1/2007 | Andersen et al. |
| 7,216,249 B2 | 5/2007 | Fujiwara et al. |
| 7,279,964 B2 | 10/2007 | Bolz et al. |
| 7,302,354 B2 | 11/2007 | Zhuge |
| 7,312,734 B2 | 12/2007 | McNeill et al. |
| 7,315,204 B2 | 1/2008 | Seven |
| 7,365,664 B2 | 4/2008 | Caduff et al. |
| 7,378,902 B2 | 5/2008 | Sorrells et al. |
| 7,385,443 B1 | 6/2008 | Denison |
| 7,403,010 B1 | 7/2008 | Hertz |
| 7,440,891 B1 | 10/2008 | Shozakai et al. |
| 7,522,677 B2 | 4/2009 | Liang |
| 7,583,215 B2 | 9/2009 | Yamamoto et al. |
| 7,671,768 B2 | 3/2010 | De Ceuninck |
| 7,679,538 B2 | 3/2010 | Tsang |
| 7,737,776 B1 | 6/2010 | Cyrusian |
| 7,893,856 B2 | 2/2011 | Ek et al. |
| 7,924,189 B2 | 4/2011 | Sayers |
| 7,937,106 B2 | 5/2011 | Sorrells et al. |
| 7,952,502 B2 | 5/2011 | Kolze et al. |
| 8,060,663 B2 | 11/2011 | Murray et al. |
| 8,130,126 B2 | 3/2012 | Breitschaedel et al. |
| 8,194,889 B2 | 6/2012 | Seefeldt |
| 8,298,425 B2 | 10/2012 | Kanbe |
| 8,330,631 B2 | 12/2012 | Kumar et al. |
| 8,362,936 B2 | 1/2013 | Ledzius et al. |
| 8,483,753 B2 | 7/2013 | Behzad et al. |
| 8,508,397 B2 | 8/2013 | Hisch |
| 8,717,211 B2 | 5/2014 | Miao et al. |
| 8,786,477 B1 | 7/2014 | Albinet |
| 8,836,551 B2 | 9/2014 | Nozaki |
| 8,873,182 B2 | 10/2014 | Liao et al. |
| 8,878,708 B1 | 11/2014 | Sanders et al. |
| 8,952,837 B2 | 2/2015 | Kim et al. |
| 9,071,201 B2 | 6/2015 | Jones et al. |
| 9,071,267 B1 | 6/2015 | Schneider et al. |
| 9,071,268 B1 | 6/2015 | Schneider et al. |
| 9,118,401 B1 | 8/2015 | Nieto et al. |
| 9,148,164 B1 | 9/2015 | Schneider et al. |
| 9,171,552 B1 | 10/2015 | Yang |
| 9,178,462 B2 | 11/2015 | Kurosawa et al. |
| 9,210,506 B1 | 12/2015 | Nawfal et al. |
| 9,306,588 B2 | 4/2016 | Das et al. |
| 9,337,795 B2 | 5/2016 | Das et al. |
| 9,391,576 B1 | 7/2016 | Satoskar et al. |
| 9,444,504 B1 | 9/2016 | Robinson et al. |
| 9,525,940 B1 | 12/2016 | Schneider et al. |
| 9,543,975 B1 | 1/2017 | Melanson et al. |
| 9,596,537 B2 | 3/2017 | He et al. |
| 9,635,310 B2 | 4/2017 | Chang et al. |
| 9,680,488 B2 | 6/2017 | Das et al. |
| 9,762,255 B1 | 9/2017 | Satoskar et al. |
| 9,774,342 B1 | 9/2017 | Schneider et al. |
| 9,807,504 B2 | 10/2017 | Melanson et al. |
| 9,813,814 B1 | 11/2017 | Satoskar |
| 9,831,843 B1 | 11/2017 | Das et al. |
| 2001/0001547 A1 | 5/2001 | Delano et al. |
| 2001/0009565 A1 | 7/2001 | Singvall |
| 2004/0078200 A1 | 4/2004 | Alves |
| 2004/0184621 A1 | 9/2004 | Andersen et al. |
| 2005/0068097 A1 | 3/2005 | Kim et al. |
| 2005/0084037 A1 | 4/2005 | Liang |
| 2005/0258989 A1 | 11/2005 | Li et al. |
| 2005/0276359 A1 | 12/2005 | Xiong |
| 2006/0056491 A1 | 3/2006 | Lim et al. |
| 2006/0064037 A1 | 3/2006 | Shalon et al. |
| 2006/0098827 A1 | 5/2006 | Paddock et al. |
| 2006/0261886 A1 | 11/2006 | Hansen et al. |
| 2006/0284675 A1 | 12/2006 | Krochmal et al. |
| 2007/0018719 A1 | 1/2007 | Seven |
| 2007/0026837 A1 | 2/2007 | Bagchi |
| 2007/0057720 A1 | 3/2007 | Hand et al. |
| 2007/0092089 A1 | 4/2007 | Seefeldt et al. |
| 2007/0103355 A1 | 5/2007 | Yamada |
| 2007/0120721 A1 | 5/2007 | Caduff et al. |
| 2007/0123184 A1 | 5/2007 | Nesimoglu et al. |
| 2007/0146069 A1 | 6/2007 | Wu et al. |
| 2008/0012639 A1 | 1/2008 | Mels |
| 2008/0030577 A1 | 2/2008 | Cleary et al. |
| 2008/0114239 A1 | 5/2008 | Randall et al. |
| 2008/0143436 A1 | 6/2008 | Xu |
| 2008/0159444 A1 | 7/2008 | Terada |
| 2008/0198048 A1 | 8/2008 | Klein et al. |
| 2008/0292107 A1 | 11/2008 | Bizjak |
| 2009/0015327 A1 | 1/2009 | Wu et al. |
| 2009/0021643 A1 | 1/2009 | Hsueh et al. |
| 2009/0051423 A1 | 2/2009 | Miaille et al. |
| 2009/0058531 A1 | 3/2009 | Hwang et al. |
| 2009/0084586 A1 | 4/2009 | Nielsen |
| 2009/0220110 A1 | 9/2009 | Bazarjani et al. |
| 2010/0168882 A1 | 7/2010 | Zhang et al. |
| 2010/0176980 A1 | 7/2010 | Breitschadel et al. |
| 2010/0183163 A1 | 7/2010 | Matsui et al. |
| 2011/0013733 A1 | 1/2011 | Martens et al. |
| 2011/0025540 A1 | 2/2011 | Katsis |
| 2011/0029109 A1 | 2/2011 | Thomsen et al. |
| 2011/0063148 A1 | 3/2011 | Kolze et al. |
| 2011/0096370 A1 | 4/2011 | Okamoto |
| 2011/0136455 A1 | 6/2011 | Sundstrom et al. |
| 2011/0150240 A1 | 6/2011 | Akiyama et al. |
| 2011/0170709 A1 | 7/2011 | Guthrie et al. |
| 2011/0188671 A1 | 8/2011 | Anderson et al. |
| 2011/0228952 A1 | 9/2011 | Lin |
| 2011/0242614 A1 | 10/2011 | Okada |
| 2011/0268301 A1 | 11/2011 | Nielsen et al. |
| 2011/0285463 A1 | 11/2011 | Walker et al. |
| 2012/0001786 A1 | 1/2012 | Hisch |
| 2012/0047535 A1 | 2/2012 | Bennett et al. |
| 2012/0133411 A1 | 5/2012 | Miao et al. |
| 2012/0177201 A1 | 7/2012 | Ayling et al. |
| 2012/0177226 A1 | 7/2012 | Silverstein et al. |
| 2012/0188111 A1 | 7/2012 | Ledzius et al. |
| 2012/0207315 A1 | 8/2012 | Kimura et al. |
| 2012/0242521 A1 | 9/2012 | Kinyua |
| 2012/0250893 A1 | 10/2012 | Carroll et al. |

(56) References Cited

U.S. PATENT DOCUMENTS

| | | |
|---|---|---|
| 2012/0263090 A1 | 10/2012 | Porat et al. |
| 2012/0274490 A1 | 11/2012 | Kidambi et al. |
| 2012/0280726 A1 | 11/2012 | Colombo et al. |
| 2012/0293348 A1 | 11/2012 | Snelgrove |
| 2013/0095870 A1 | 4/2013 | Phillips et al. |
| 2013/0106635 A1 | 5/2013 | Doi |
| 2013/0129117 A1 | 5/2013 | Thomsen et al. |
| 2013/0188808 A1 | 7/2013 | Pereira et al. |
| 2013/0241753 A1 | 9/2013 | Nozaki |
| 2013/0241755 A1 | 9/2013 | Chen et al. |
| 2014/0044280 A1 | 2/2014 | Jiang |
| 2014/0105256 A1 | 4/2014 | Hanevich et al. |
| 2014/0105273 A1 | 4/2014 | Chen et al. |
| 2014/0126747 A1 | 5/2014 | Huang |
| 2014/0135077 A1 | 5/2014 | Leviant et al. |
| 2014/0184332 A1 | 7/2014 | Shi et al. |
| 2014/0269118 A1 | 9/2014 | Taylor et al. |
| 2014/0368364 A1 | 12/2014 | Hsu |
| 2015/0009079 A1 | 1/2015 | Bojer |
| 2015/0170663 A1 | 6/2015 | Disch et al. |
| 2015/0214974 A1 | 7/2015 | Currivan |
| 2015/0214975 A1 | 7/2015 | Gomez et al. |
| 2015/0249466 A1 | 9/2015 | Elyada |
| 2015/0295584 A1 | 10/2015 | Das et al. |
| 2015/0327174 A1 | 11/2015 | Rajagopal et al. |
| 2015/0381130 A1* | 12/2015 | Das ........................ H03M 1/70 381/107 |
| 2016/0072465 A1 | 3/2016 | Das et al. |
| 2016/0080862 A1 | 3/2016 | He et al. |
| 2016/0080865 A1 | 3/2016 | He et al. |
| 2016/0139230 A1 | 5/2016 | Petrie et al. |
| 2016/0173112 A1 | 6/2016 | Das et al. |
| 2016/0181988 A1 | 6/2016 | Du et al. |
| 2016/0286310 A1 | 9/2016 | Das et al. |
| 2016/0365081 A1 | 12/2016 | Satoskar et al. |
| 2017/0047895 A1 | 2/2017 | Zanbaghi |
| 2017/0150257 A1 | 5/2017 | Das et al. |
| 2017/0212721 A1 | 7/2017 | Satoskar et al. |

FOREIGN PATENT DOCUMENTS

| | | | |
|---|---|---|---|
| EP | 1244218 | A1 | 9/2002 |
| EP | 1575164 | A2 | 9/2005 |
| EP | 1689075 | A1 | 8/2006 |
| EP | 1753130 | A1 | 2/2007 |
| EP | 1798852 | A | 6/2009 |
| EP | 2207264 | A1 | 7/2010 |
| GB | 1599401 | A | 9/1981 |
| GB | 2119189 | A | 11/1983 |
| GB | 2307121 | A | 6/1997 |
| GB | 2507096 | A | 4/2014 |
| GB | 2527637 | A | 12/2015 |
| GB | 2527677 | B | 10/2016 |
| GB | 2537694 | A | 10/2016 |
| GB | 2537697 | A | 10/2016 |
| GB | 2539517 | A | 12/2016 |
| JP | 2008294803 | A | 12/2008 |
| WO | WO0054403 | A1 | 9/2000 |
| WO | 02/37686 | A2 | 5/2002 |
| WO | 2006018750 | A1 | 2/2006 |
| WO | 2007005380 | A2 | 1/2007 |
| WO | 2007136800 | A2 | 11/2007 |
| WO | 2008067260 | A1 | 6/2008 |
| WO | 2014113471 | A1 | 7/2014 |
| WO | 2015160655 | A1 | 10/2015 |
| WO | 2016040165 | A1 | 3/2016 |
| WO | 2016040171 | A1 | 3/2016 |
| WO | 2016040177 | A1 | 3/2016 |
| WO | 2016160336 | A1 | 10/2016 |
| WO | 2016202636 | A1 | 12/2016 |
| WO | 2017116629 | A1 | 7/2017 |

OTHER PUBLICATIONS

Thaden, Rainer et al., A Loudspeaker Management System with FIR/IRR Filtering; Slides from a presentation given at the 32nd AES conference "DSP for Loudspeakers" in Hillerod, Denmark in Sep. 2007; http://www.four-audio.com/data/AES32/AES32FourAudio.pdf; 23 pages.

GB Patent Application No. 1419651.3, Improved Analogue-to-Digital Convertor, filed Nov. 4, 2014, 65 pages.

Combined Search and Examination Report, GB Application No. GB1506258.1, dated Oct. 21, 2015, 6 pages.

International Search Report and Written Opinion, International Patent Application No. PCT/US2015/025329, dated Aug. 11, 2015, 9 pages.

International Search Report and Written Opinion, International Patent Application No. PCT/US2015/048633, dated Dec. 10, 2015, 11 pages.

International Search Report and Written Opinion, International Patent Application No. PCT/US2015/048591, dated Dec. 10, 2015, 11 pages.

Combined Search and Examination Report, GB Application No. GB1510578.6, dated Aug. 3, 2015, 3 pages.

International Search Report and Written Opinion, International Application No. PCT/US2015/056357, dated Jan. 29, 2015, 13 pages.

Combined Search and Examination Report, GB Application No. GB1514512.1, dated Feb. 11, 2016, 7 pages.

International Search Report and Written Opinion, International Application No. PCT/US2015/048609, dated Mar. 23, 2016, 23 pages.

International Search Report and Written Opinion, International Application No. PCT/US2016/022578, dated Jun. 22, 2016, 12 pages.

Combined Search and Examination Report, GB Application No. GB1600528.2, dated Jul. 7, 2016, 8 pages.

Combined Search and Examination Report, GB Application No. GB1603628.7, dated Aug. 24, 2016, 6 pages.

International Search Report and Written Opinion, International Application No. PCT/EP2016/062862, dated Aug. 26, 2016, 14 pages.

Combined Search and Examination Report, GB Application No. GB1602288.1, dated Aug. 9, 2016, 6 pages.

International Search Report and Written Opinion of the International Searching Authority, International Application No. PCT/US2016/065134, dated Mar. 15, 2017.

International Search Report and Written Opinion of the International Searching Authority, International Application No. PCT/US2016/040096, dated Mar. 24, 2017.

International Search Report and Written Opinion of the International Searching Authority, International Application No. PCT/US2017/014240, dated Apr. 24, 2017.

Groeneweg, B.P., et al, A Class-AB/D Audio Power Amplifier for Mobile Applications Integrated Into a 2.5G/3G Baseband Processo1016r, IEEE Transactions on Circuits and Systems—I: Regular Papers, vol. 57, No. 5, May 2010, pp. 1003-1016.

Chen, K., et al., A High-PSRR Reconfigurable Class-AB/D Audio. Amplifier Driving a Hands-Free/Receiver. 2-in-1 Loudspeaker, IEEE Journal of Solid-State Circuits, vol. 47, No. 11, Nov. 2012, pp. 2586-2603.

Combined Search and Examination Report under Sections 17 and 18(3) of the UKIPO, Application No. GB1620427.3, dated Jun. 1, 2017.

Combined Search and Examination Report under Sections 17 and 18(3) of the UKIPO, Application No. GB1620428.1, dated Jul. 21, 2017.

Combined Search and Examination Report under Sections 17 and 18(3), United Kingdom Intellectual Property Office, Application No. GB1700371.6, dated Aug. 1, 2017.

Combined Search and Examination Report under Sections 17 and 18(3), United Kingdom Intellectual Property Office, Application No. GB1702540.4, dated Oct. 2, 2017.

(56) References Cited

OTHER PUBLICATIONS

Combined Search and Examination Report under Sections 17 and 18(3), United Kingdom Intellectual Property Office, Application No. GB1702655.0, dated Oct. 24, 2017.
Combined Search and Examination Report under Sections 17 and 18(3), United Kingdom Intellectual Property Office, Application No. GB1706693.7, dated Oct. 26, 2017.
Combined Search and Examination Report under Sections 17 and 18(3), United Kingdom Intellectual Property Office, Application No. GB1706690.3, dated Oct. 30, 2017.
Search Report under Section 17, United Kingdom Intellectual Property Office, Application No. GB1702656.8, dated Oct. 31, 2017.
International Search Report and Written Opinion of the International Searching Authority, International Patent Application No. PCT/US2017/045861, dated Nov. 14, 2017.
International Search Report and Written Opinion of the International Searching Authority, International Patent Application No. PCT/US2017/046083, dated Nov. 14, 2017.
Combined Search and Examination Report under Sections 17 and 18(3), United Kingdom Intellectual Property Office, Application No. GB1708546.5, dated Nov. 22, 2017.
Combined Search and Examination Report under Sections 17 and 18(3), United Kingdom Intellectual Property Office, Application No. GB1708544.0, dated Nov. 28, 2017.
International Search Report and Written Opinion of the International Searching Authority, International Patent Application No. PCT/US2017/052439, dated Dec. 14, 2017.
Chen, Kuo-Hsin, et al., A 106dB PSRR Direct Battery Connected Reconfigurable Class-AB/D Speaker Amplifier for Hands-Free/Receiver 2-in-1 Loudspeaker, Solid State Circuits Conference (A-SSCC), 2011 IEEE Asian, Nov. 14, 2011, pp. 221-224.

* cited by examiner

OPTIMIZATION OF PERFORMANCE AND POWER IN AUDIO SYSTEM

FIELD OF DISCLOSURE

The present disclosure relates in general to circuits for audio devices, including without limitation personal audio devices such as wireless telephones and media players, and more specifically, to systems and methods for optimizing performance and power in an audio system comprising a multi-path analog-to-digital converter and a dynamic range enhancement based digital-to-analog converter.

BACKGROUND

Personal audio devices, including wireless telephones, such as mobile/cellular telephones, cordless telephones, mp3 players, and other consumer audio devices, are in widespread use. Such personal audio devices may include circuitry for driving a pair of headphones or one or more speakers. Such circuitry often includes a power amplifier for driving an audio output signal to headphones or speakers.

One particular characteristic of a personal audio device which may affect its marketability and desirability is the dynamic range of its audio output signal. Stated simply, the dynamic range is the ratio between the largest and smallest values of the audio output signal. One way to increase dynamic range is through the use of a multipath analog-to-digital subsystem comprising a plurality of parallel analog-to-digital converters (ADCs). Multipath circuits including multiple parallel ADCs may reduce noise as one path may be optimized for processing small amplitude signals (e.g., for processing low noise signals) while another circuit path may be optimized for large amplitude signals (e.g., allowing for higher dynamic range). Examples of such multipath circuits are disclosed in U.S. Pat. No. 9,071,267 (the "Schneider Reference"), which is incorporated herein by reference.

Another way to increase dynamic range is through the use of signal magnitude-dependent digital gain and a corresponding analog attenuation applied to a digital-to-analog conversion subsystem comprising a digital-to-analog conversion subsystem having a digital gain and an output amplifier having an analog gain (or attenuation). Such a digital-to-analog conversion subsystem may enhance dynamic range as compared to approaches in which the digital gain and analog attenuation are static, as it may reduce the noise injected into audio output signal $V_{OUT}$, which noise may be a generally monotonically increasing function of the gain/attenuation of the output amplifier. Examples of such digital-to-analog conversion subsystems are disclosed in U.S. patent application Ser. No. 14/083,972 (the "Satoskar Reference"), which is incorporated herein by reference.

SUMMARY

In accordance with the teachings of the present disclosure, one or more disadvantages and problems associated with existing approaches to optimizing power and performance of an audio signal path may be reduced or eliminated.

In accordance with embodiments of the present disclosure, a method for operating a playback path comprising a first dynamic range enhancement subsystem and a second dynamic range enhancement subsystem, wherein an audio signal generated by the first dynamic range enhancement subsystem is communicated to the second dynamic range enhancement subsystem, is provided. The method may include determining a first operating parameter of one of the first dynamic range enhancement subsystem and the second dynamic range enhancement subsystem that affects behavior of the other of the first dynamic range enhancement subsystem and the second dynamic range enhancement subsystem, communicating a control signal between the first dynamic range enhancement subsystem and the second dynamic range enhancement subsystem indicative of the first operating parameter, and setting a second operating parameter of the other of the first dynamic range enhancement subsystem and the second dynamic range enhancement subsystem in response to receipt of the control signal.

In accordance with embodiments of the present disclosure, a system may have a playback path comprising a first dynamic range enhancement subsystem and a second dynamic range enhancement subsystem communicatively coupled to the first dynamic range enhancement subsystem such that an audio signal generated by the first dynamic range enhancement subsystem is communicated to the second dynamic range enhancement subsystem. The first dynamic range enhancement subsystem and the second dynamic range enhancement subsystem may be configured to, either alone or in concert with one another, determine a first operating parameter of one of the first dynamic range enhancement subsystem and the second dynamic range enhancement subsystem that affects behavior of the other of the first dynamic range enhancement subsystem and the second dynamic range enhancement subsystem, communicate a control signal between the first dynamic range enhancement subsystem and the second dynamic range enhancement subsystem indicative of the first operating parameter, and set a second operating parameter of the other of the first dynamic range enhancement subsystem and the second dynamic range enhancement subsystem in response to receipt of the control signal.

In accordance with these and other embodiments of the present disclosure, an integrated circuit may include circuitry configured to determine a first operating parameter of one of a first dynamic range enhancement subsystem and a second dynamic range enhancement subsystem communicatively coupled to the first dynamic range enhancement subsystem such that an audio signal generated by the first dynamic range enhancement subsystem is communicated to the second dynamic range enhancement subsystem, wherein the first operating parameter affects behavior of the other of the first dynamic range enhancement subsystem and the second dynamic range enhancement subsystem, and communicate a control signal between the first dynamic range enhancement subsystem and the second dynamic range enhancement subsystem indicative of the first operating parameter such that a second operating parameter of the other of the first dynamic range enhancement subsystem and the second dynamic range enhancement subsystem is set in response to receipt of the control signal.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
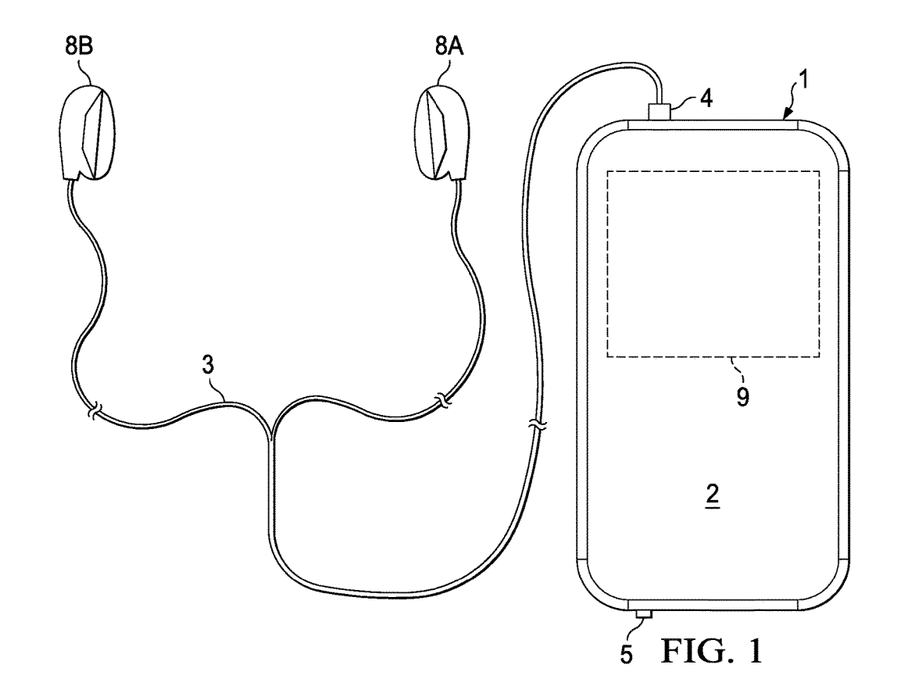
FIG. 1 is an illustration of an example personal audio device, in accordance with embodiments of the present disclosure.

FIG. 1 is an illustration of an example personal audio device 1, in accordance with embodiments of the present disclosure. FIG. 1 depicts personal audio device 1 coupled to a headset 3 in the form of a pair of earbud speakers 8A and 8B. Headset 3 depicted in FIG. 1 is merely an example, and it is understood that personal audio device 1 may be used in connection with a variety of audio transducers, including without limitation, headphones, earbuds, in-ear earphones, and external speakers. A plug 4 may provide for connection of headset 3 to an electrical terminal of personal audio device 1. Personal audio device 1 may provide a display to a user and receive user input using a touch screen 2, or alternatively, a standard LCD may be combined with various buttons, sliders, and/or dials disposed on the face and/or sides of personal audio device 1. An audio input 5 may provide for receipt of an analog audio signal. For example, in some embodiments, audio input 5 may comprise a microphone. As another example, audio input 5 may comprise a "line in" input jack for receiving a corresponding plug of an analog audio source. As also shown in FIG. 1, personal audio device 1 may include an audio system 9 for generating an analog audio signal for transmission to headset 3 and/or another audio transducer.

Figure 2:
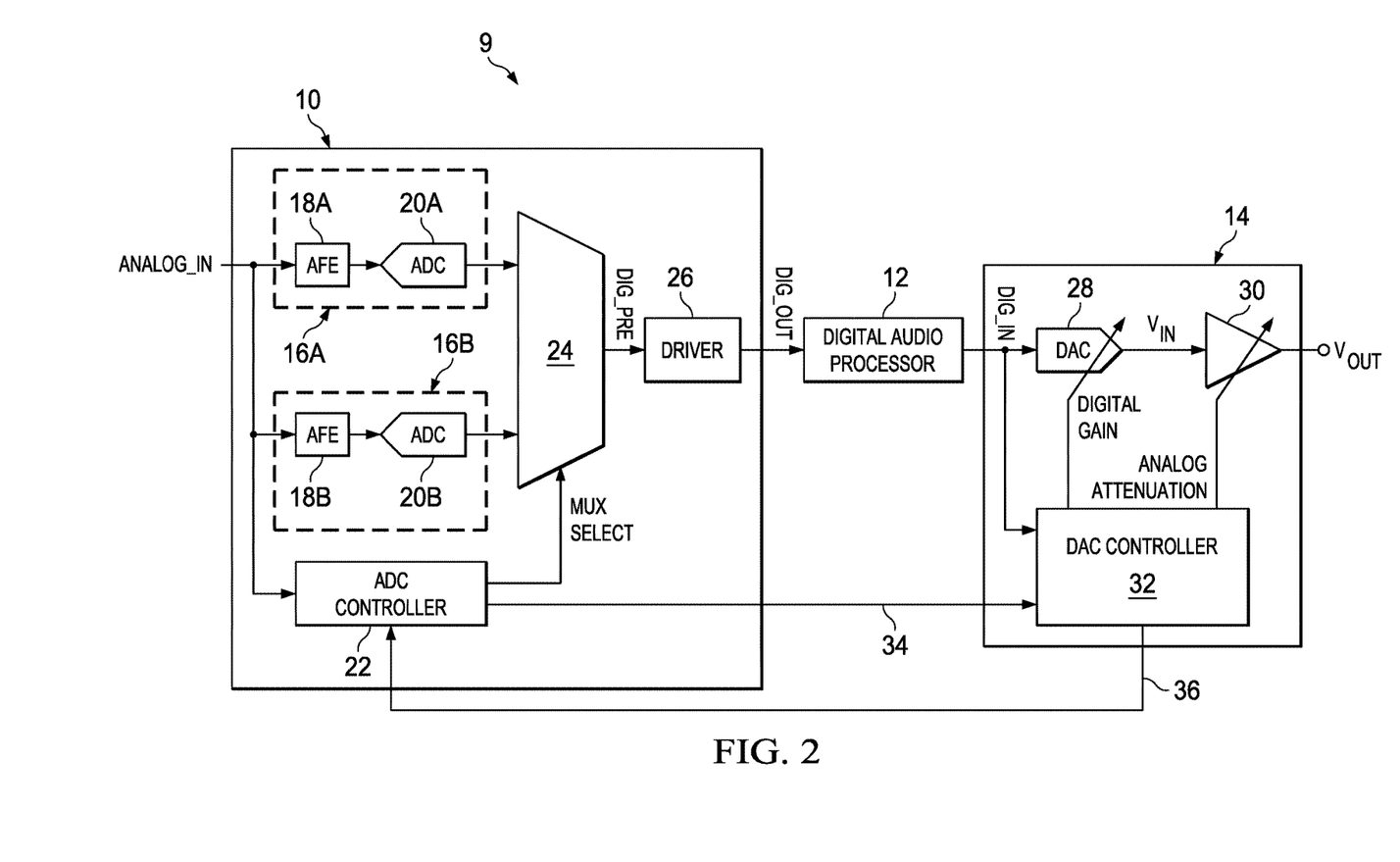
FIG. 2 is a block diagram of selected components of an example audio integrated system of a personal audio device, in accordance with embodiments of the present disclosure.

FIG. 2 is a block diagram of selected components of an example audio system 9 of a personal audio device, in accordance with embodiments of the present disclosure. As shown in FIG. 2, audio system 9 may include an analog-to-digital conversion (ADC) subsystem 10, a digital audio processor 12, and a digital-to-analog conversion (DAC) subsystem 14. ADC subsystem 10 may be configured to, as described in greater detail below, receive an analog input signal ANALOG_IN (e.g., via audio input 5) and convert analog input signal ANALOG_IN to an equivalent digital signal DIG_OUT. A digital audio processor 12 may perform audio processing on digital signal DIG_OUT (e.g., volume control based on a volume setting, adaptive noise cancellation, frequency equalization, etc.) to generate a digital signal DIG_IN to be communicated to DAC subsystem 14. DAC subsystem 14 may be configured to, as described in greater detail below, receive digital input signal DIG_IN and convert digital input signal DIG_IN to an equivalent analog output signal $V_{OUT}$ (e.g., which may be driven to a transducer, such as one of earbud speakers 8A and 8B).

As shown in FIG. 2, ADC subsystem 10 may include two or more processing paths 16A and 16B (which may be referred to herein individually as a processing path 16 and collectively as processing paths 16), each processing path 16 including a respective analog front end (AFE) 18 (e.g., AFE 18A, AFE 18B) and a respective ADC 20 (e.g., ADC 20A, ADC 20B). An AFE 18 may receive analog input signal ANALOG_IN via one or more input lines which may allow for receipt of a single-ended signal, differential signal, or any other suitable analog signal format and may comprise any suitable system, device, or apparatus configured to condition analog input signal ANALOG_IN for processing by ADC 20. Example embodiments of AFEs 18 are described in the Schneider reference. The output of each AFE 18 may be communicated to a respective ADC 20.

An ADC 20 may comprise any suitable system, device, or apparatus configured to convert an analog signal received at its input, to a digital signal representative of such analog signal. An ADC 20 may itself include one or more components (e.g., delta-sigma modulator, decimator, etc.) for carrying out the functionality of ADC 20. Example embodiments of ADCs 20 are described in the Schneider reference.

A multiplexer 24 may receive a respective digital signal from each of processing paths 16 and may select one of the digital signals as digital signal DIG_PRE based on a control signal generated by and communicated from ADC controller 22, as described in greater detail below.

Driver 26 may receive the digital signal DIG_PRE output by multiplexer 24 and may comprise any suitable system, device, or apparatus configured to condition such digital signal (e.g., encoding into Audio Engineering Society/European Broadcasting Union (AES/EBU), Sony/Philips Digital Interface Format (S/PDIF)), in the process generating digital output signal DIG_OUT for transmission over a bus to digital audio processor 12. In FIG. 2, the bus receiving digital output signal DIG_OUT is shown as single-ended. In some embodiments, driver 26 may generate a differential digital output signal DIG_OUT.

ADC controller 22 may comprise any suitable system, device, or apparatus for selecting one of the digital signals output by the various processing paths 16 as digital output signal DIG_OUT (e.g., selecting between gain modes of ADC subsystem 10). In some embodiments, ADC controller 22 may make such selection based on a magnitude of analog input signal ANALOG_IN or a signal derivative thereof. For example, ADC controller 22 may include an overload detector (not shown) that may determine whether or not analog input signal ANALOG_IN or a derivative thereof (e.g., an output of a modulator of a delta-sigma modulator of ADC 20A) is likely to cause clipping or other distortion of digital output signal DIG_OUT if a particular processing path (e.g., processing path 16A) is selected. If clipping or other distortion of digital output signal DIG_OUT is likely if the particular processing path (e.g., processing path 16A) is selected, ADC controller 22 may generate a control signal so that another processing path (e.g., processing path 16B) is selected. To further illustrate, in some embodiments, processing path 16A may be a path adapted for low amplitudes of analog input signal ANALOG_IN and may thus have a high signal gain, while processing path 16B may be a path adapted for higher amplitudes of analog input signal ANALOG_IN and may thus have a lower signal gain. Thus, if analog input signal ANALOG_IN or a derivative thereof is greater than a threshold value indicative of a condition whereby digital output signal DIG_OUT may experience clipping or other distortion if processing path 16A is selected, ADC controller 22 may detect such condition, and generate a control signal to select the digital signal generated by processing path 16B as digital output signal DIG_OUT.

As another example, ADC controller 22 may include a level detector (not shown) that may detect an amplitude of analog input signal ANALOG_IN or a signal derivative thereof (e.g., a signal generated within ADC 20B). Responsive to the detected signal, ADC controller 22 may generate the control signal communicated to multiplexer 24. To illustrate, as analog input signal ANALOG_IN decreases from a relatively high amplitude to a lower amplitude, it may cross a threshold amplitude level whereby ADC controller 22 may change the selection of digital output signal DIG_OUT from the digital signal generated by processing path 16B (which may be adapted for higher amplitudes of analog input signal ANALOG_IN) to the digital signal generated by processing path 16A (which may be adapted for lower amplitudes of analog input signal ANALOG_IN). In some embodiments, a threshold amplitude level whereby ADC controller 22 may change the selection of digital output signal DIG_OUT from the digital signal generated by processing path 16B to the digital signal generated by processing path 16B may be lower than another threshold amplitude level whereby ADC controller 22 may change the selection of digital output signal DIG_OUT from the digital signal generated by processing path 16A to the digital signal generated by processing path 16B, in order to provide for hysteresis so that multiplexer 24 does not repeatedly switch between the paths in the event that the magnitude of audio input signal ANALOG_IN persists near the threshold.

As a further example, ADC controller 22 may be configured to determine that a transition between the first processing path and the second processing path needs to occur based on the analog input signal ANALOG_IN crossing a threshold or a prediction that the input signal will cross the threshold. An example of such predictive methodology is described in U.S. patent application Ser. No. 15/003,371 (the "Second Satoskar Reference"), which is incorporated herein by reference. As also described in the Second Satoskar Reference, such prediction may include a prediction of, a magnitude of the analog input signal ANALOG_IN crossing a predetermined threshold magnitude, the magnitude of the analog input signal ANALOG_IN lacking a persistent pattern of magnitude relative to the predetermined threshold magnitude, and/or the magnitude of the analog input signal ANALOG_IN refraining from crossing a predetermined threshold magnitude for a period of time.

Also as shown in FIG. 2, digital audio processor 12 may supply a digital audio input signal DIG_IN to a digital-to-analog converter (DAC) 28 of DAC subsystem 14, which may in turn supply an analog audio signal $V_{IN}$ to a power amplifier stage 30 of DAC subsystem 14 which may amplify or attenuate the audio signal $V_{IN}$ and provide an audio output signal $V_{OUT}$, which may operate a speaker (e.g., earbuds 8A and/or 8B), headphone transducer, and/or a line level signal output. As shown in FIG. 2, DAC subsystem 14 may also include a DAC controller 32 configured to, based on digital audio input signal DIG_IN, control a programmable digital gain of DAC 28 and a programmable analog attenuation of amplifier 30.

As an example of the functionality of DAC controller 32, when a magnitude of digital audio input signal DIG_IN is at or near zero decibels (dB) relative to the full-scale magnitude of the digital audio input signal, DAC controller 32 may apply a unity gain (0 dB) to both of the digital gain and the analog attenuation. However, if the magnitude of the digital audio input signal DIG_IN is below a particular predetermined threshold magnitude relative to the full-scale magnitude of digital audio input signal DIG_IN (e.g., −20 dB), DAC controller 32 may apply a non-unity digital gain (e.g., 20 dB) to the digital gain and a corresponding non-unity attenuation (e.g., −20 dB) to the analog attenuation (although the analog attenuation may be further modified based on a volume control setting). Such approach may increase the dynamic range of DAC subsystem 14 compared to approaches in which the digital gain and analog attenuation are static, as it may reduce the noise injected into audio output signal $V_{OUT}$, which noise may be a generally monotonically increasing function of the gain/attenuation of amplifier 30. While such noise may be negligible for higher magnitude audio signals (e.g., at or near 0 dB), the presence of such noise may become noticeable for lower magnitude audio signals (e.g., at or near −20 dB or lower). By applying an analog attenuation at amplifier 30, the amount of noise injected into audio output signal $V_{OUT}$ may be reduced, while the signal level of audio output signal $V_{OUT}$ may be maintained in accordance with the digital audio input signal DIG_IN through application of a digital gain to DAC 28 equal in magnitude to the analog attenuation. A description of example components and functionality of DAC controller 32 is set forth in the Satoskar reference. For example, as set forth in the Satoskar reference, in some embodiments, DAC controller 32 may be configured to switch between gain modes of DAC subsystem 14 in response to a zero crossing of digital input signal DIG_IN, so as to reduce or eliminate distortion caused by switching gain modes. As another example, as set forth in the Satoskar reference, in some embodiments, DAC controller 32 may be configured to ramp or step in discrete increments the digital gain and analog attenuation when transitioning between gain modes, in order to reduce or eliminate distortion caused by switching gain modes.

As a further example, DAC controller 32 may be configured to predict, based on one or more characteristics of a signal indicative of an output signal (e.g., audio output signal $V_{OUT}$), an occurrence of a condition for changing the digital gain and the analog attenuation, and responsive to predicting the occurrence of the condition, change, at an approximate zero crossing of the signal indicative of the output signal, the digital gain and the analog attenuation. An example of such predictive methodology is described in U.S. patent application Ser. No. 14/083,972 (the "Das Reference"), which is incorporated herein by reference. As also described in the Das Reference, such condition for changing the digital gain and the analog attenuation may include, without limitation, a magnitude of a signal indicative of an output signal crossing a predetermined threshold magnitude, the magnitude of the signal indicative of the output signal lacking a persistent pattern of magnitude relative to the predetermined threshold magnitude, and/or the magnitude of the signal indicative of the output signal refraining from crossing a predetermined threshold magnitude for a period of time.

As shown in FIG. 2, ADC controller 22 may be configured to communicate a control signal 34 to control operation of DAC controller 32, and likewise, DAC controller 32 may be configured to communicate a control signal 36 to control operation of ADC controller 22. During operation of audio system 9, it may occur that respective noise floors of ADC subsystem 10 and DAC subsystem 14 may be substantially different. For example, in an example embodiment, ADC subsystem 10 may have a noise floor of −120 dB relative to full-scale magnitude when the higher-gain processing path 16A is selected, and a noise floor of −100 dB relative to full-scale magnitude when the lower-gain processing path 16B is selected, with a threshold of −30 dB relative to full-scale magnitude for switching between processing paths 16. In such embodiment, DAC subsystem 14 may have a noise floor of −120 dB relative to full-scale magnitude when the higher-dynamic range gain mode (e.g., increased digital gain, increased analog attenuation) is selected, and may have a noise floor of −90 dB relative to full-scale magnitude when the lower-dynamic range gain mode (e.g., decreased digital gain, decreased analog attenuation), with a threshold of −20 dB relative to full-scale magnitude for switching between gain modes. Thus, in the presence of a −25 dB relative to full-scale magnitude audio signal (and no processing by digital audio processor 12 which alters such magnitude), in existing approaches to path control, ADC subsystem 10 having crossed its −30 dB threshold may switch to the higher-gain, lower noise floor processing path 16A. However, because DAC subsystem 14 is below its −20 dB threshold, the lower-dynamic range gain mode would be selected in existing approaches. Accordingly, using existing approaches in this example instance, the increase in dynamic range of ADC subsystem 10 may be of little use, as dynamic range of overall audio system 9 may be limited by the smaller dynamic range of DAC subsystem 14, and by switching to the higher-gain, lower noise floor processing path 16A, overall audio system 9 may consume more power with no corresponding increase in performance Other situations may be present in existing approaches in which DAC subsystem 14 may be in a higher dynamic range mode with a low noise floor while ADC subsystem 10 selects the lower-gain, higher noise floor processing path 16B, such that audio system 9 may exhibit a power increase with no corresponding performance increase.

Accordingly, in accordance with systems and methods of the present disclosure, ADC controller 22 and/or DAC controller 32, working in concert, may via communication of control signals 34 and 36, determine whether an output of ADC subsystem 10 (e.g., digital signal DIG_OUT) is communicated to an input of DAC subsystem 14. In response to determining that the output of ADC subsystem 10 is communicated to the input of DAC subsystem 14, ADC controller 22 and/or DAC controller 32, working in concert, may via communication of control signals 34 and 36 determine the relative noise floors of ADC subsystem 10 and DAC subsystem 14. In response to determining that a DAC noise floor of DAC subsystem 14 is higher than an ADC noise floor of ADC subsystem 10, ADC controller 22 may optimize ADC subsystem 10 such that the ADC noise floor is more closely matched to the DAC noise floor (e.g., by selecting the lower-gain, higher noise floor processing path 16B regardless of the magnitude of analog input signal ANALOG_IN). In response to determining that the DAC noise floor is lower than the ADC noise floor, DAC controller 32 may optimize DAC subsystem 14 such that the DAC noise floor is more closely matched to the ADC noise floor (e.g., by selecting the lower dynamic range, higher noise floor gain mode regardless of the magnitude of digital signal DIG_IN).

In these and other embodiments, in response to a gain mode of the ADC subsystem 10 from a high-gain mode to a low-gain mode (e.g., switching of selection from processing path 16A to processing path 16B), ADC controller 22 may communicate an indication (e.g., via control signal 34) to DAC controller 32 of the switching from the high-gain mode to the low-gain mode. In response, DAC controller 32 may cause DAC subsystem 14 to switch between gain modes (e.g., from the high-gain mode to the low-gain mode) responsive to the indication. Such feedforward indication of the switching between gain modes of ADC subsystem 10 from its high-gain mode to its low-gain mode may be advantageous, as signal clipping due to fast-rising signals in DAC subsystem 14 may be a concern. By using such feed-forward indication, DAC subsystem 14 may begin an early transition between gain modes even though a fast-rising signal has not yet propagated via the signal path to the input of DAC subsystem 14 (e.g., digital input signal DIG_IN). For example, in response to receiving such feed-forward indication, DAC controller 32 may begin looking for zero crossings of digital input signal DIG_IN and switch an occurrence of zero crossing of digital input signal DIG_IN in response to such feed-forward indication even if the fast-rising audio signal has yet to propagate to the input of DAC subsystem 14. As another example, in response to receiving such feed-forward indication, DAC controller 32 may begin ramping or stepping between gain levels of the digital gains of the two gain modes and ramping or stepping between attenuation levels of the two gain modes in response to such feed-forward indication even if the fast-rising audio signal has yet to propagate to the input of DAC subsystem 14.

Figure 3:
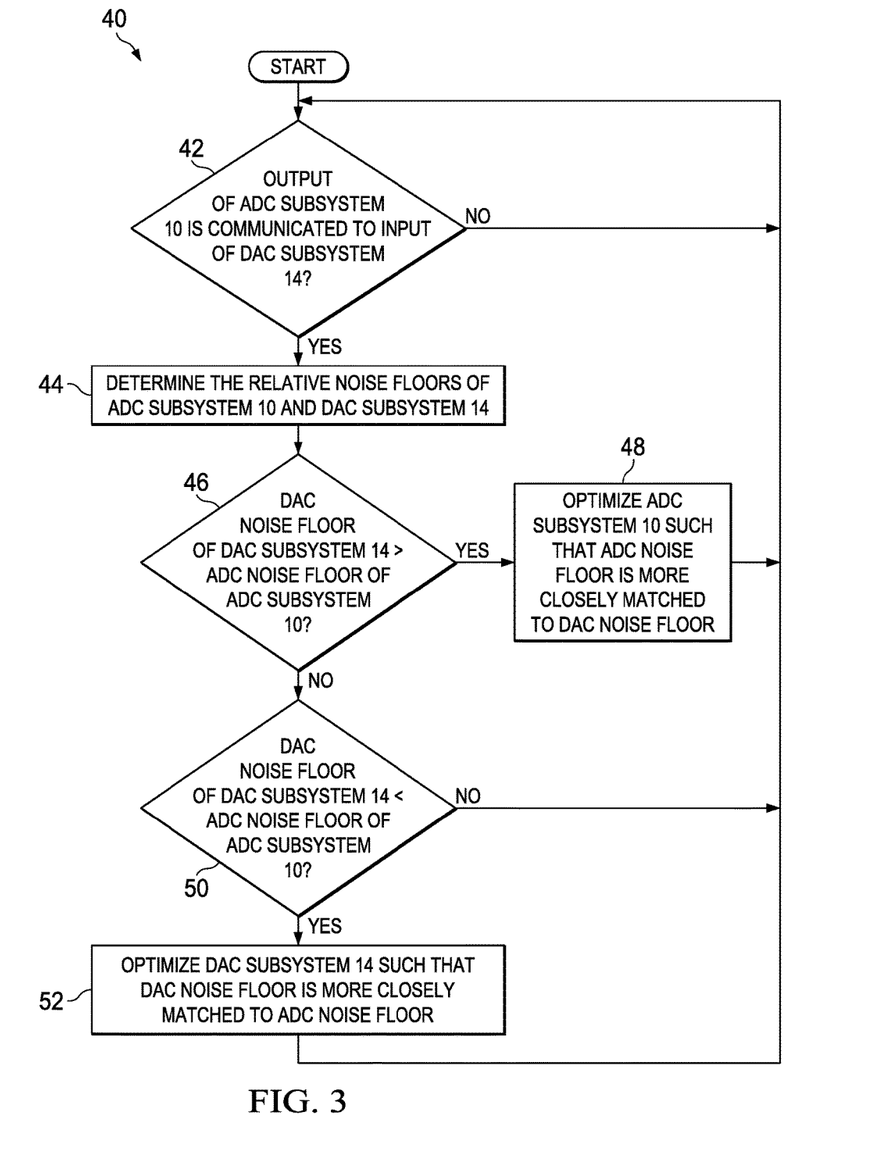
FIG. 3 illustrates a flow chart of an example method for optimization of performance and power in an audio system, in accordance with embodiments of the present disclosure.

FIG. 3 illustrates a flow chart of an example method 40 for optimization of performance and power in an audio system, in accordance with embodiments of the present disclosure. According to one embodiment, method 40 may begin at step 42. As noted above, teachings of the present disclosure may be implemented in a variety of configurations of audio system 9. As such, the preferred initialization point for method 40 and the order of the steps comprising method 40 may depend on the implementation chosen.

At step 42, ADC controller 22 and/or DAC controller 32 may determine whether an output of ADC subsystem 10 is communicated to an input of DAC subsystem 14. If an output of ADC subsystem 10 is communicated to an input of DAC subsystem 14, method 40 may proceed to step 44. Otherwise, method 40 may remain at step 42 until such time as it is determines that an output of ADC subsystem 10 is communicated to an input of DAC subsystem 14.

At step 44, responsive to a determination that an output of ADC subsystem 10 is communicated to an input of DAC subsystem 14, ADC controller 22 and/or DAC controller 32, working in concert, may via communication of control signals 34 and 36 determine the relative noise floors of ADC subsystem 10 and DAC subsystem 14. At step 46, ADC controller 22 and/or DAC controller 32 may determine whether a DAC noise floor of DAC subsystem 14 is higher than an ADC noise floor of ADC subsystem 10. If the DAC noise floor is higher than the ADC noise floor, method 40 may proceed to step 48. Otherwise, method 40 may proceed to step 50.

At step 48, responsive to a determination that the DAC noise floor is higher than the ADC noise floor, ADC controller 22 may optimize ADC subsystem 10 such that the ADC noise floor is more closely matched to the DAC noise floor (e.g., by selecting the lower-gain, higher noise floor processing path 16B regardless of the magnitude of analog input signal ANALOG_IN). After completion of step 48, method 40 may proceed again to step 42.

At step 50, ADC controller 22 and/or DAC controller 32 may determine whether a DAC noise floor of DAC subsystem 14 is lower than an ADC noise floor of ADC subsystem 10. If the DAC noise floor is lower than the ADC noise floor, method 40 may proceed to step 52. Otherwise, method 40 may proceed again to step 42.

At step 52, responsive to a determination that the DAC noise floor is lower than the ADC noise floor, DAC controller 32 may optimize DAC subsystem 14 such that the DAC noise floor is more closely matched to the ADC noise floor (e.g., by selecting the lower dynamic range, higher noise floor gain mode regardless of the magnitude of digital signal DIG_IN). After completion of step 52, method 40 may proceed again to step 42.

Although FIG. 3 discloses a particular number of steps to be taken with respect to method 40, method 40 may be executed with greater or lesser steps than those depicted in FIG. 3. In addition, although FIG. 3 discloses a certain order of steps to be taken with respect to method 40, the steps comprising method 40 may be completed in any suitable order.

Method 40 may be implemented using audio system 9 or any other system operable to implement method 40. In certain embodiments, method 40 may be implemented partially or fully in software and/or firmware embodied in computer-readable media.

Figure 4:
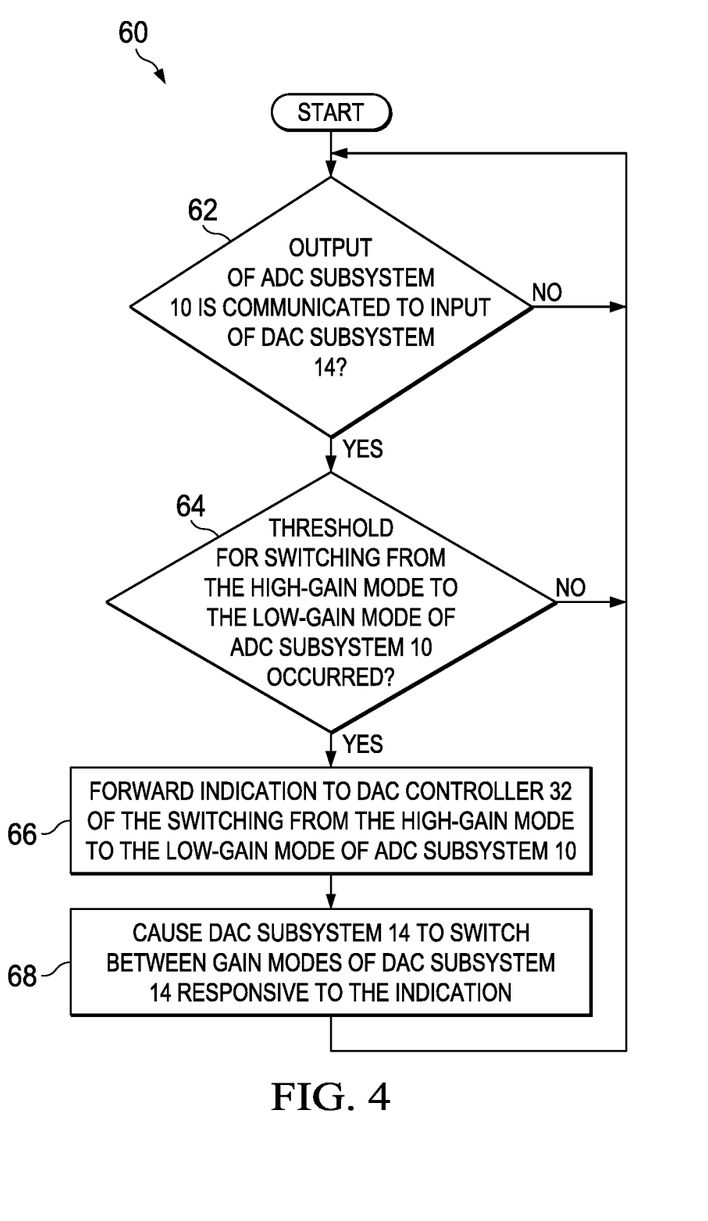
FIG. 4 illustrates a flow chart of another example method for optimization of performance and power in an audio system, in accordance with embodiments of the present disclosure.

FIG. 4 illustrates a flow chart of another example method 60 for optimization of performance and power in an audio system, in accordance with embodiments of the present disclosure. According to one embodiment, method 60 may begin at step 62. As noted above, teachings of the present disclosure may be implemented in a variety of configurations of audio system 9. As such, the preferred initialization point for method 60 and the order of the steps comprising method 60 may depend on the implementation chosen.

At step 62, ADC controller 22 and/or DAC controller 32 may determine whether an output of ADC subsystem 10 is communicated to an input of DAC subsystem 14. If an output of ADC subsystem 10 is communicated to an input of DAC subsystem 14, method 60 may proceed to step 64. Otherwise, method 60 may remain at step 62 until such time as it is determines that an output of ADC subsystem 10 is communicated to an input of DAC subsystem 14.

At step 64, responsive to a determination that an output of ADC subsystem 10 is communicated to an input of DAC subsystem 14, ADC controller 22 may determine if a threshold for switching from the high-gain mode to the low-gain mode of ADC subsystem 10 has occurred. If the threshold for switching from the high-gain mode to the low-gain mode of ADC subsystem 10 has occurred, method 60 may proceed to step 66. Otherwise, method 60 may proceed again to step 62.

At step 66, responsive to the threshold for switching from the high-gain mode to the low-gain mode of ADC subsystem 10, ADC controller 22 may forward an indication to DAC controller 32 of the switching from the high-gain mode to the low-gain mode of ADC subsystem 10. At step 68, DAC controller 32 may cause DAC subsystem 14 to switch between gain modes of DAC subsystem 14 responsive to the indication.

Although FIG. 4 discloses a particular number of steps to be taken with respect to method 60, method 60 may be executed with greater or lesser steps than those depicted in FIG. 4. In addition, although FIG. 4 discloses a certain order of steps to be taken with respect to method 60, the steps comprising method 60 may be completed in any suitable order.

Method 60 may be implemented using audio system 9 or any other system operable to implement method 60. In certain embodiments, method 60 may be implemented partially or fully in software and/or firmware embodied in computer-readable media.

This disclosure encompasses all changes, substitutions, variations, alterations, and modifications to the exemplary embodiments herein that a person having ordinary skill in the art would comprehend. Similarly, where appropriate, the appended claims encompass all changes, substitutions, variations, alterations, and modifications to the exemplary embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the invention and the concepts contributed by the inventor to furthering the art, and are construed as being without limitation to such specifically recited examples and conditions. Although embodiments of the present inventions have been described in detail, it should be understood that various changes, substitutions, and alterations could be made hereto without departing from the spirit and scope of the disclosure.

What is claimed is:

1. A method for operating a playback path comprising a first dynamic range enhancement subsystem having an analog-to-digital converter (ADC) subsystem and a second dynamic range enhancement subsystem having a digital-to-analog converter (DAC) subsystem, wherein an audio signal generated by the first dynamic range enhancement subsystem is communicated to the second dynamic range enhancement subsystem, the method comprising:
   determining a first operating parameter of one of the first dynamic range enhancement subsystem and the second dynamic range enhancement subsystem that affects behavior of the other of the first dynamic range enhancement subsystem and the second dynamic range enhancement subsystem;
   communicating a control signal between the first dynamic range enhancement subsystem and the second dynamic range enhancement subsystem indicative of the first operating parameter; and
   setting a second operating parameter of the other of the first dynamic range enhancement subsystem and the second dynamic range enhancement subsystem in response to receipt of the control signal;
   wherein:
      the first operating parameter comprises one of an ADC noise floor of the ADC subsystem and a DAC noise floor of the DAC subsystem; and
      the second operating parameter comprises the other of the ADC noise floor of the ADC subsystem and the DAC noise floor of the DAC subsystem.

2. The method of claim 1,
   further comprising:
      in response to determining that the DAC noise floor of the DAC subsystem is higher than the ADC noise floor of the ADC subsystem, optimizing the ADC subsystem such that the ADC noise floor is more closely matched to the DAC noise floor; and
      in response to determining that the DAC noise floor is lower than the ADC noise floor, optimizing the DAC subsystem such that the DAC noise floor is more closely matched to the ADC noise floor.

3. The method of claim 2, further comprising:
   determining whether an output of the ADC subsystem is communicated to an input of the DAC subsystem; and optimizing the DAC subsystem or optimizing the ADC subsystem in response to determining that the output of the ADC subsystem is communicated to the input of the DAC subsystem.

4. The method of claim 2, further comprising, in response to a gain mode of the ADC subsystem switching from a high-gain mode to a low-gain mode:
  forwarding an indication from the ADC subsystem to the DAC subsystem of the switching from the high-gain mode to the low-gain mode; and
  switching the DAC subsystem between gain modes of the DAC subsystem responsive to the indication.

5. A system having a playback path comprising:
  a first dynamic range enhancement subsystem having an analog-to-digital converter (ADC) subsystem; and
  a second dynamic range enhancement subsystem having a digital-to-analog converter (DAC) subsystem and communicatively coupled to the first dynamic range enhancement subsystem such that an audio signal generated by the first dynamic range enhancement subsystem is communicated to the second dynamic range enhancement subsystem;
  wherein the first dynamic range enhancement subsystem and the second dynamic range enhancement subsystem are configured to, in concert with one another:
    determine a first operating parameter of one of the first dynamic range enhancement subsystem and the second dynamic range enhancement subsystem that affects behavior of the other of the first dynamic range enhancement subsystem and the second dynamic range enhancement subsystem;
    communicate a control signal between the first dynamic range enhancement subsystem and the second dynamic range enhancement subsystem indicative of the first operating parameter; and
    set a second operating parameter of the other of the first dynamic range enhancement subsystem and the second dynamic range enhancement subsystem in response to receipt of the control signal; and
  wherein:
    the first operating parameter comprises one of an ADC noise floor of the ADC subsystem and a DAC noise floor of the DAC subsystem; and
    the second operating parameter comprises the other of the ADC noise floor of the ADC subsystem and the DAC noise floor of the DAC subsystem.

6. The system of claim 5, wherein
  the first dynamic range enhancement subsystem and the second dynamic range enhancement subsystem are further configured to, in concert with one another:
  in response to determining that the DAC noise floor of the DAC subsystem is higher than the ADC noise floor of the ADC subsystem, optimize the ADC subsystem such that the ADC noise floor is more closely matched to the DAC noise floor; and
  in response to determining that the DAC noise floor is lower than the ADC noise floor, optimize the DAC subsystem such that the DAC noise floor is more closely matched to the ADC noise floor.

7. The system of claim 6, wherein the first dynamic range enhancement subsystem and the second dynamic range enhancement subsystem are further configured to, in concert with one another:
  determine whether an output of the ADC subsystem is communicated to an input of the DAC subsystem; and
  optimize the DAC subsystem or optimize the ADC subsystem in response to determining that the output of the ADC subsystem is communicated to the input of the DAC subsystem.

8. The system of claim 6, wherein the first dynamic range enhancement subsystem and the second dynamic range enhancement subsystem are further configured to, in concert with one another:
  forward an indication from the ADC subsystem to the DAC subsystem of switching from high-gain mode to low-gain mode; and
  switch the DAC subsystem between gain modes of the DAC subsystem responsive to the indication.

9. An integrated circuit comprising circuitry configured to:
  determine a first operating parameter of one of a first dynamic range enhancement subsystem having an analog-to-digital converter (ADC) subsystem and a second dynamic range enhancement subsystem having a digital-to-analog converter (DAC) subsystem and communicatively coupled to the first dynamic range enhancement subsystem such that an audio signal generated by the first dynamic range enhancement subsystem is communicated to the second dynamic range enhancement subsystem, wherein the first operating parameter affects behavior of the other of the first dynamic range enhancement subsystem and the second dynamic range enhancement subsystem; and
  communicate a control signal between the first dynamic range enhancement subsystem and the second dynamic range enhancement subsystem indicative of the first operating parameter such that a second operating parameter of the other of the first dynamic range enhancement subsystem and the second dynamic range enhancement subsystem is set in response to receipt of the control signal;
  wherein:
    the first operating parameter comprises one of an ADC noise floor of the ADC subsystem and a DAC noise floor of the DAC subsystem; and
    the second operating parameter comprises the other of the ADC noise floor of the ADC subsystem and the DAC noise floor of the DAC subsystem.

10. The integrated circuit of claim 9, wherein
  the circuitry is further configured to:
  in response to determining that the DAC noise floor of the DAC subsystem is higher than the ADC noise floor of the ADC subsystem, optimize the ADC subsystem such that the ADC noise floor is more closely matched to the DAC noise floor; and
  in response to determining that the DAC noise floor is lower than the ADC noise floor, optimize the DAC subsystem such that the DAC noise floor is more closely matched to the ADC noise floor.

11. The integrated circuit of claim 10, wherein the circuitry is further configured to:
  determine whether an output of the ADC subsystem is communicated to an input of the DAC subsystem; and
  optimize the DAC subsystem or optimize the ADC subsystem in response to determining that the output of the ADC subsystem is communicated to the input of the DAC subsystem.

12. The integrated circuit of claim 10, wherein the first dynamic range enhancement subsystem and the circuitry is further configured to:

forward an indication from the ADC subsystem to the DAC subsystem of switching from high-gain mode to low-gain mode; and switch the DAC subsystem between gain modes of the DAC subsystem responsive to the indication.

\* \* \* \* \*